United States Patent [19]

Yamanaka

[11] Patent Number: 4,855,928

[45] Date of Patent: Aug. 8, 1989

[54] WIRE BONDING DEVICE

[75] Inventor: Kazuyuki Yamanaka, Yokohama, Japan

[73] Assignee: Kabushiki Kaisha Toshiba, Kawasaki, Japan

[21] Appl. No.: 92,369

[22] Filed: Sep. 2, 1987

[30] Foreign Application Priority Data

Sep. 2, 1986 [JP] Japan ................................ 61-206555

[51] Int. Cl.$^4$ ......................... G06F 15/60; G06K 9/64
[52] U.S. Cl. ..................................... 364/489; 364/488;
382/34; 382/8; 356/392; 356/397; 356/399;
228/4.5
[58] Field of Search ............... 364/488–491;
382/8, 34; 228/4.5, 179; 356/375, 392, 393, 394,
397, 399

[56] References Cited

U.S. PATENT DOCUMENTS

| | | | |
|---|---|---|---|
| 3,973,713 | 8/1976 | Furuya et al. | 228/4.5 |
| 4,070,117 | 1/1978 | Johannsmeier et al. | 356/172 |
| 4,163,212 | 7/1979 | Buerger et al. | 364/490 |
| 4,233,625 | 11/1980 | Altman | 328/8 |
| 4,347,964 | 9/1982 | Takasugi et al. | 228/4.5 |
| 4,450,579 | 5/1984 | Nakashima et al. | 364/490 |
| 4,491,962 | 1/1985 | Sakou et al. | 382/50 |
| 4,651,341 | 3/1987 | Nakashima et al. | 382/8 |
| 4,672,557 | 6/1987 | Tamura et al. | 364/490 |
| 4,750,836 | 6/1988 | Stein | 356/399 |

FOREIGN PATENT DOCUMENTS 0041870 12/1981 European Pat. Off. ............ 364/491

OTHER PUBLICATIONS

Catalogue of Model 1471 High-Productivity Wedge Bonding System, Kulicke and Soffa Industries, Inc.
Sales Literature for Hughes HMC-2460 Automatic Wire Bonder.

Primary Examiner—Parshotam S. Lall
Assistant Examiner—V. N. Trans
Attorney, Agent, or Firm—Oblon, Spivak, McClelland, Maier & Neustadt

[57] ABSTRACT

A wire bonding device including a camera for producing image signals corresponding to a field of view including an object having plural target patterns on which wire bonding is to be performed, a displacement device for altering the field view of the camera by varying the relative positioning between the camera and the object, a monitor for displaying an image of the object to be wire bonded, a reference mark display generation circuit coupled to the camera and the monitor for combining reference mark signals with the image signals so that an image of a reference mark is superimposed on the image of each target displayed by said monitor, a reference mark generation circuit for storing data corresponding to plural reference marks and for producing reference mark signals defining a selected reference mark and applying the reference mark signals to the reference mark display generation circuit, and an input selection and control device coupled to the reference mark generation circuit for selecting a reference mark shape and size tailored to each target pattern and for producing corresponding selection signals applied to the reference mark generation circuit, which then produces the reference mark signals in correspondance with the selection signals.

5 Claims, 4 Drawing Sheets

WIRE BONDING DEVICE

BACKGROUND OF THE INVENTION

1. Field of the Invention

This invention relates to a wire bonding device, and in particular to a wire bonding device wherein a position to be bonded can be specified while viewing its image on a monitor.

2. Description of the Background

In the manufacture of semiconductor devices, the wire bonding step, wherein a bonding pad on a semiconductor pellet and an inner lead are electrically connected by bonding wires, is a very important step. A special wire bonding device is used for this step. To carry out wire bonding, the bonding position coordinates have to be input to this wire bonding device. The most usual method of inputting these coordinates is to perform a teaching operation in which the object on which wire bonding is to be performed is locally magnified by a TV camera and displayed as an image on a monitor. The operator carries out an operation of specifying the coordinates at which bonding is to be performed, while viewing this image on the monitor. The sequence of operations is as follows:

(1) The XY stage of the bonding device is moved and adjusted so that a point on the object, which is to be the starting point of the first wire, is displayed at a central position of the monitor image. After this adjustment has been completed, a prescribed input switch is operated to store the coordinates of this starting point in RAM in the bonding device. This is called the teaching operation.

(2) Next, the same teaching operation is carried out for the coordinates of the point that is to be the end point of the first wire, and these are stored in RAM.

(3) The above steps (1) and (2) are carried out sequentially for all the wires.

(4) Lastly, revision and alteration are carried out by again performing steps (1) and (2) for the wires whose position is required to be revised and altered. If revision is to be carried out by a bodily parallel shift of all the bonding positions, the amount of parallel shift for both axes can be set by an operation similar to the teaching operation shown in step (1).

In the teaching operation above described, the operator specifies the bonding positions while viewing the image on the monitor. Reference marks are used as an aid for carrying out this alignment. An example of the reference marks which are displayed on the monitor is shown in FIG. 1 and consists of a reference mark 1 arranged in the form of a cross, and rectangular reference mark 2. The operator aligns a target pattern on the object with the central position on the monitor using these reference marks as a guide.

However, the accuracy of alignment of conventional devices is adversely affected by the fact that it is difficult to always display the most appropriate reference marks for the various different target patterns. For example, when connecting the bonding pads on a semiconductor pellet and the ends of inner leads by wire bonding, the bonding positions must be specified while alternately displaying the bonding pad and the end of the inner lead on the monitor. However, since the bonding pad and inner leads are of different shape and size, precise alignment cannot be achieved using the same reference marks.

To overcome this problem, a device has been designed wherein a rectangular pattern 2 can be set having the desired size and height/width ratio. However, this device is complicated and troublesome to operate because the size of the rectangular pattern and height/width ratio must be changed for each different target pattern from the bonding pad to the inner leads.

SUMMARY OF THE INVENTION

Accordingly, an object of this invention is to provided a wire bonding device whereby the bonding operation can be carried out easily and accurately by making it possible to display the optimum reference mark for various kinds of target patterns.

This object is achieved according to the present invention by providing a new and improved wire bonding device including a camera for producing image signals corresponding to a field of view including an object having plural target patterns on which wire bonding is to be performed, a displacement device for altering the field of view of the camera by varying the relative positioning between the camera and the object, a monitor for displaying an image of the object to be wire bonded, a reference mark display generation circuit coupled to the camera and the monitor for combining reference mark signals with the image signals so that an image of a reference mark is superimposed on the image of each target pattern displayed by the monitor, a reference mark generation circuit for storing data corresponding to plural reference marks and for producing reference mark signals defining a selected reference mark and applying the reference mark signals to the reference mark display generation circuit, and input selection and control device coupled to the reference mark generation circuit for selecting a reference mark shape and size tailored to each target pattern and for producing corresponding selection signals applied to the reference mark generation circuit, which then produces the reference mark signals in correspondance with the selection signals.

By means of the device according to the present invention, the optimum reference mark for the target pattern may be set beforehand for each target pattern. Furthermore, when each target pattern is displayed on the monitor, the set optimum reference pattern may be superimposed on it. An accurate teaching operation may thus be performed.

BRIEF DESCRIPTION OF THE DRAWINGS

A more complete appreciation of the invention and many of the attendant advantages thereof will be readily obtained as the same becomes better understood from the following detailed description given by way of example only and with reference to the accompanying drawings, wherein.

DESCRIPTION OF THE PREFERRED EMBODIMENTS

Figure 1:
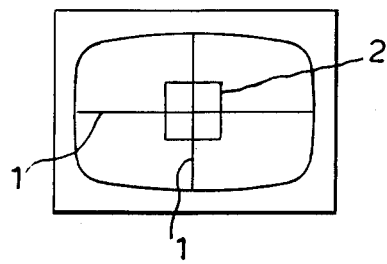
FIG. 1 is an illustration of reference marks as employed in a conventional wire bonding device.
Figure 2A:
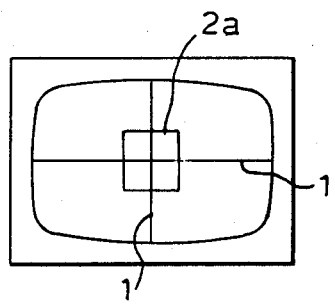
FIG. 2a and 2b are illustrations of examples of reference marks as employed in a wire bonding device embodying the present invention.
Figure 2B:
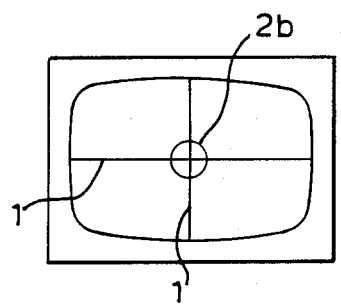

Referring now to the drawings, wherein like reference numerals designate identical or corresponding parts throughout the several views, the case which is first considered in explaining the present invention is one in which a bonding pad and the end of an inner lead are connected by wire bonding. In this case, the operator first selects and sets the optimum reference mark for alignment of the bonding pad, and sets the optimum reference mark for alignment of the ends of the inner leads. For example, for the bonding pad, he sets a square pattern 2a as shown in FIG. 2(a), and for the ends of the inner leads he sets a circular pattern 2b as shown in FIG. 2(b). For this operation, the selected reference marks are displayed and the device that displays the reference marks is provided with the function of freely varying and displaying rectangular patterns having any desired height and width dimensions and circular patterns having any desired radius. Thus the operator can easily set the optimum reference mark shape and size. The respective reference marks for each target pattern ( in this case, the bonding pad and the ends of the inner leads) are then stored.

Figure 3A:
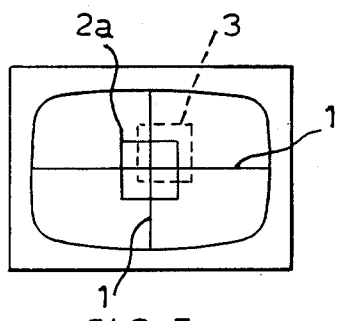
FIGS. 3a and 3b are illustrations of use of the reference marks superimposed over target patterns in performing wire bonding using an embodiment of the present invention.
Figure 3B:
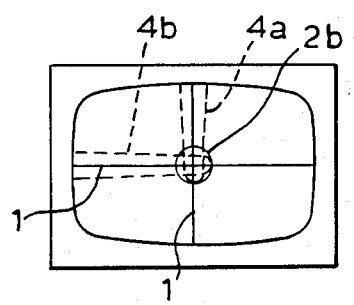

Apart from these reference marks, the device also stores data indicating the sequence of the teaching operation. In a preferred embodiment, the teaching operation is conducted in the following sequence: beginning from the first bonding pad, then the first inner lead, then the second bonding pad, then the second inner lead, and so forth. The teaching operation is therefore carried out while the bonding pads and inner leads are alternately displayed on the monitor. The device therefore displays the reference marks alternately, changing the display in accordance with the stored data indicating the sequence of the teaching operation. For example, when position specification is being carried out for bonding pad 3, the square pattern shown in FIG. 2(a) is selected for display and displayed in relation to the bonding pad 3 as shown in FIG. 3(a), while when position specification is being carried out for inner leads 4a or 4b, the circular pattern 2b shown in FIG. 2(b) is selected and displayed in relation to the inner leads as shown in FIG. 3(b). Thus, by arranging for two reference marks to be displayed alternately in synchronism with the input operation for position specification, while the position of bonding pad 3 is being specified, alignment can be carried out using the most suitable reference mark pattern, i.e., the square pattern 2a, and while the positions of inner leads 4a and 4b are being specified, alignment can be carried out using the pattern which is most suitable for them, i.e. the circular pattern 2b. No troublesome operations are required during changeover of the reference mark, since this is performed automatically in accordance with the data indicating the sequence of the teaching operation.

Figure 4:
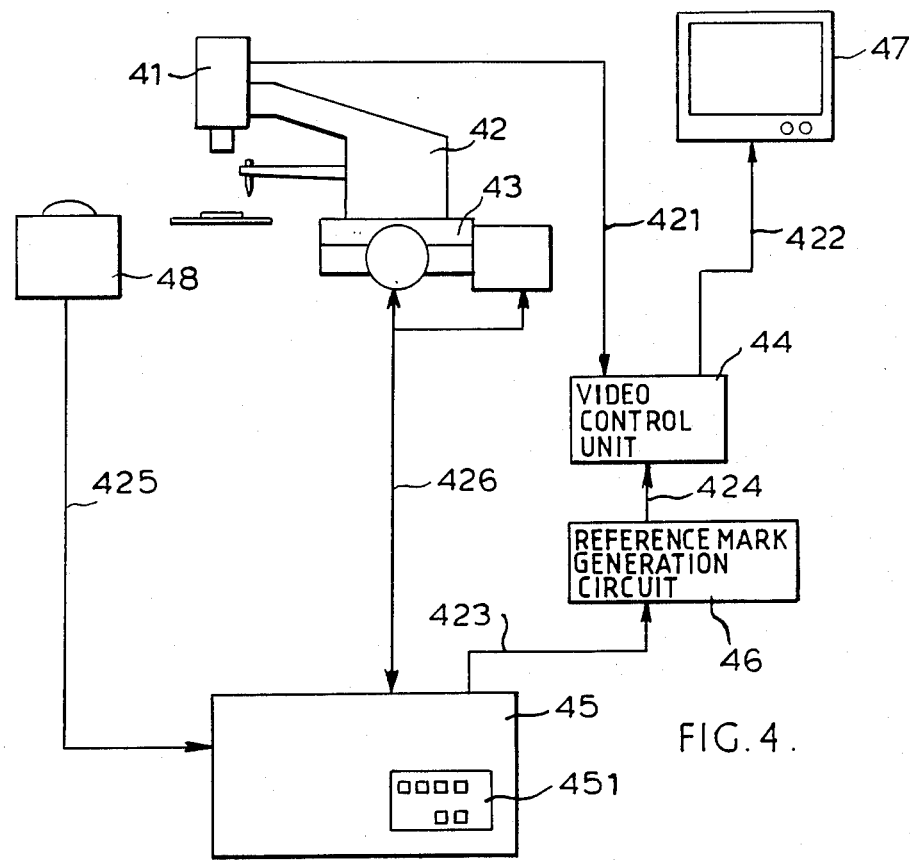
FIG. 4 is a schematic block diagram illustrating one embodiment of the wire bonding device according to the present invention.

Referring now to FIG. 4, the preferred embodiment of the bonding device of the present invention is shown in more detail. As shown in FIG. 4, the bonding device includes a camera 41 used to obtain a locally enlarged image of an object to be wire bonded. The camera 41 is mounted on a bonding head 42, which is mounted on an XY table 43. A microprocessor based main controller 45 is employed to control operation of the camera 41 and XY table 43.

An operator can input instructions to the controller 45 by means of a manipulator instruction input device 48. In particular, an operator controls moving of the picture field of view of the camera 41 by inputting a signal 425 defining a movement direction and amount through the input device 48. The controller 45 receives the signal 425 and produces drive control signals 426 to the XY table 43 whereby the position of the field of view of the camera 41 is controlled.

The controller 45, in response to reference mark selection data applied to the controller 45 from reference mark selection device 451, produces control data on the signal line 423 connected to a reference mark generation circuit 46. The circuit 46 outputs a signal 424 corresponding to a reference mark having a size and shape defined by the control data on a signal line 423. After the first control signal is received, the output of circuit 46 is maintained until the next control signal is received. The signal 424 is applied to a video control unit 44, which also has applied thereto the video output signal 421 from the camera 41. The video control unit 44 produces a composite video signal 422 of the selected reference mark superimposed on the camera video and applies the composite video signal 422 to the monitor 47.

Next described in more detail is the operation of the wire bonding device shown in FIG. 4.

The wire bonding device of the invention is charged with the task of electrically connecting two different points by means of a thin metal wire, and is used for making electrical connection between an electrode for external connection of a semiconductor pellet, i.e., a pad, and a lead for internal connection of the envelope, i.e., an inner lead.

Figure 5:
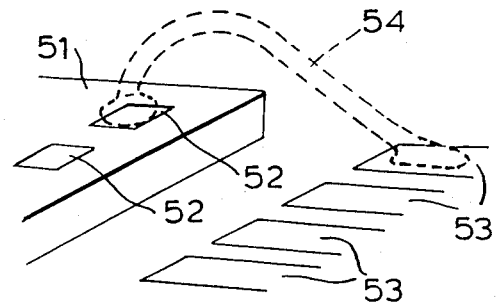
FIG. 5 is a perspective view illustrating a wire connection to be made between a bonding pad on a semiconductor pellet and an inner lead.

FIG. 5 is an explanatory drawing illustrating a semiconductor pellet 51, having a pad 52 interconnected to an inner lead 53 by means of a metal thin wire 54.

In operation, an operator of the wire bonding device in advance inputs the positions of the pads and inner leads and the number of connections per IC to be made. Further, there may be a case that the position of a reference positioning point is input also in advance, as well as the reference marks typically used in conjunction with bonding of the specific pads and inner leads.

The method to input the positions of pad and inner lead into the wire bonding device is the self-teach method which is described below.

First, when operating in the self-teach mode of wire bonding, the sequence to input the wire bonding positions is determined in advance.

Figure 7:
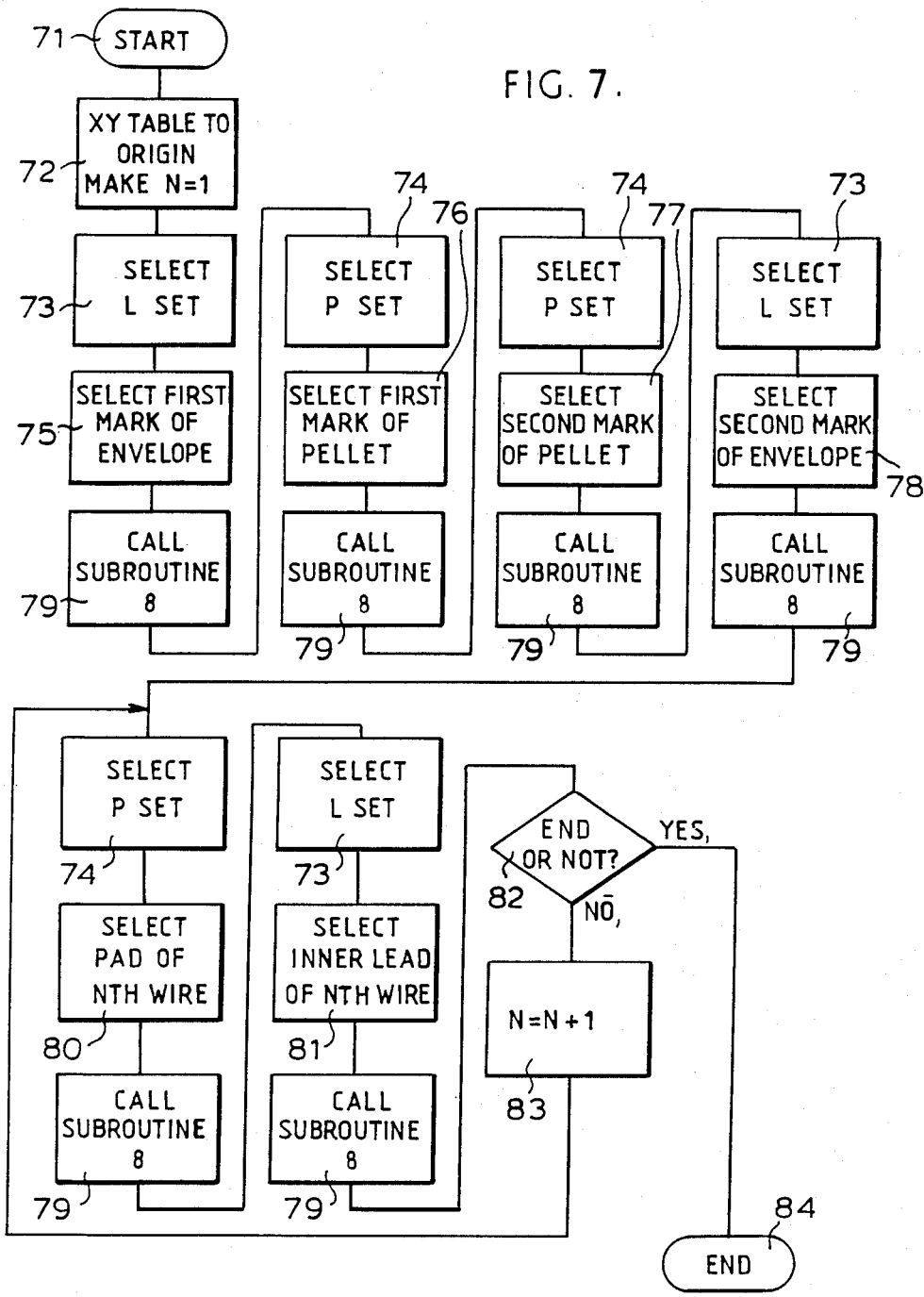
FIGS. 7 and 8 are flow charts illustrating the operation of the bonding device according to the invention.

More specifically, the following are determined in advance: step (1), point becoming the first mark for positioning of the envelope, step (2), point becoming the first mark for positioning of semiconductor pellet, step (3), point becoming the second mark for positioning of the semiconductor pellet, step (4), point becoming the second mark for positioning of the envelope, step (5), point on the pad becoming the starting point of the first connecting wire, and step (6), point on the inner lead becoming the end point of the same, (hereinafter, in the portion of the number of wires, same repetition as steps (5) and (6), and it continues until the input end switch of the wire bonding device's operation panel is pressed, this repetition is shown as the loop of step 82 in FIG. 7).

The points on which the wire bonding is performed are taught using a sample IC. In the production process, each IC will not have the same bonding points as the sample IC, because (i) the pellet is not mounted on the same position of the envelope, (ii) the envelope is not fed in the same position. Therefore, in the production process, a positioning must be made precisely by an operator or an automatic positioning machine. This positioning is performed not as a mechanical movement, as a correction of the points on which the wire bonding is performed. This correction is done by the software of wire bonding device's main controller and called "position drift correction".

Hereupon, since the points becoming the marks for positioning in steps (1) to (4) are the points becoming the targets of position drift correction, it is necessary to adopt points which an operator can designate with good repeat accuracy.

Further, the points on which the bonding is carried out after step (5) must be designated of the central point of the pad and unified optimum distance from the tip (determined by the kind of envelope) in the inner lead in terms of the quality and reliability, etc. as product (IC).

To fulfill the above-mentioned requirement, the reference mark generation circuit 46 in the present embodiment can generate and display overlayed reference marks as shown in FIGS. 2(a) and 2(b).

FIG. 2(a) shows a rectangle overlapped by a cross which defines the center of the rectangle, with the vertical and horizontal lengths of the rectangle being variable.

FIG. 2(b) shows a circle also overlapped by a cross which defines the center of the circle, with the radius of circle being variable.

The reference mark generation circuit 46 obtains information defining the general shape of the reference mark, e.g., rectangle, circle, etc., and other pertinent information such as vertical and horizontal lengths (if a rectangle), radius (if a circle) etc. in the form of the signal 423 received from the main controller 45.

The main controller 45 controls and outputs this information, and has RAM area for storing two sets of reference mark information, according to the presently described example. For the sake of convenience, these two sets are called a P set and an L set.

In the self teach mode, at the time of inputting the points related to the semiconductor pellet and pad (steps (2), (3) and (5) as above described with regard to setting points in advance), the main controller 45 outputs the information of P set to the reference mark generation circuit 46. Similarly, at the time of the points related to the envelope or inner lead, the information of L set is output.

For both P set and L set, the setting or change of their informational content i.e., changing length and or width, or changing radius, etc., can be easily carried out by seeing a reference mark displayed on the monitor unit, by the simple key operation, as they are displayed in the order in which the wire bonding is to occur. Then, a practical example of operation and a processing flow in the self teach mode of the program section of the main controller that plays a most important role to realize the present invention is explained referring to FIG. 6 to FIG. 8.

Figure 8:
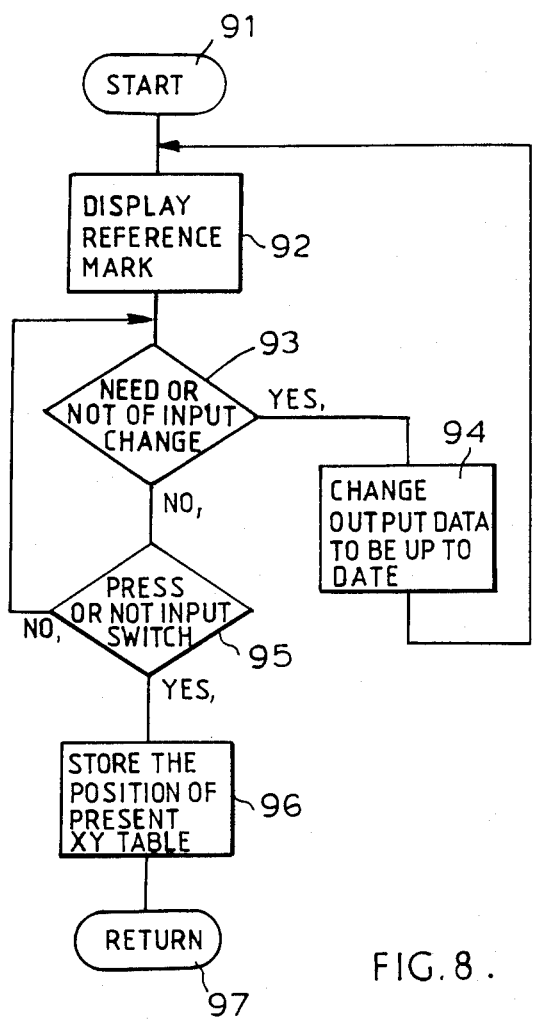

The outline flow is shown in FIG. 7. FIG. 8 shows the subroutine employed in FIG. 7.

First, as shown in FIG. 7, the operator enters into the self teach mode. Just then the program transfers the XY table to the origin (step 72), selects L set as information to output to the reference mark generation circuit (step 73) and selects memory area prepared for the first mark for positioning of the envelope as position co-ordinate storage destination (step 75). Next, the program calls the subroutine 8 (step 79).

In addition, the transfer to XY table by the manipulator input device is permitted always during processing in FIG. 7.

As shown in FIG. 4 and FIG. 8, selected control signal 423 is output to reference mark generation circuit 46. Reference mark 2b is displayed on monitor 47 (step 92). Next, the operator judges if the change of the diameter of reference mark 2b is needed (step 93), if necessary, in accordance with the input change the ouput information is changed to be up to date by reference mark selection device 451 (step 94). If not necessary, the XY table's position of the point which is to become the first mark for positioning of the envelope is stored in the memory of main controller 45 (steps 95, 96 and 97). Namely since the XY table stops in the origin position under control of the software of the main controller 45, it is enough to operate the manipulator input device 48, move the XY table 43, shift the field of view of the camera 41, match the center of the field of view, that is, the intersecting point of the cross in the reference mark, with the point which is to become the first mark for positioning of the envelope and press the input switch.

Figure 6:
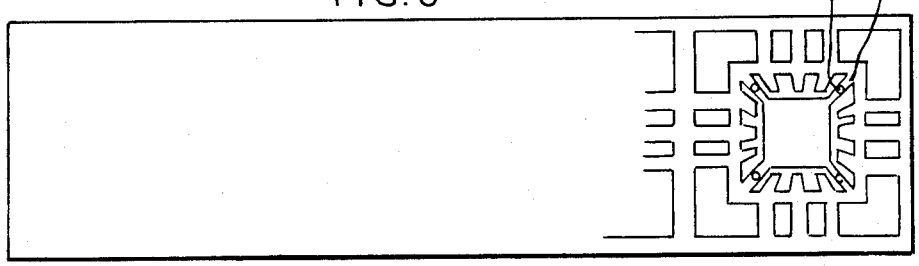
FIG. 6 is a plan view of a lead frame for semiconductor devices.

Since an operator employs the central point in a circular hole 62 on a die pad supporter 61 as a mark for positioning of the envelope, as shown in FIG. 6, by setting the shape and diameter of the reference mark in the L set information to the radius of the circular hole 62 and overlapping the circle of the reference mark with the circular hole 62, the position of the target point can be designated easily, precisely and with good repeatability.

Further, in case it is suitable to employ the rectangular reference mark according to the kind of envelope, the information of L set may be correspondingly set.

Then, the position of the point becoming the first mark for positioning of semiconductor pellet is determined in a similar way (step (2)), as shown in steps 74, 76 and 79 of FIG. 7 and FIG. 8.

Assuming that the pad located at a corner is employed as a point to be aligned with the reference mark, the rectangular reference mark is employed and the P set information defining a rectangular reference mark of the same shape and size as the pad is set and step (2) is performed.

Next, in step (3) where the position of the point becoming the second mark for positioning of the semiconductor pellet is input, the operator employs the rectangular reference mark of P set already set, and input the position of the pad which is located at the diagonal corner of the first mark for positioning of the semiconductor pallet as shown in the steps 74, 77 and 79 of FIG. 7 and FIG. 8.

Next, in step (4) where the second mark of the same of envelope is to be set, the reference mark of L set is displayed, and the position of the diagonal circular hole in step (1) is input as shown in the steps 73, 78 and 79 of FIGS. 7 and 8.

In step (5), the operator inputs information identifying the first pad to be wired, using a reference mark defined by P set information as shown in the steps 74, 80, 79 of FIGS. 7 and 8.

In step (6), the operator inputs information identifying the end position of the first inner lead, using a reference mark defined L set information as shown in the steps 73, 81 and 79 in FIGS. 7 and 8. The reference mark of L set is displayed, but at this time if the radius of a circle is changed to the distance from the tip of the inner lead as shown in FIG. 3(b), the distance from the tip against the inner lead of any angle of incidence can be unified.

Later on, step (5) and (6) are repeated for the remaining number of wires, and finally the operator presses the end switch as shown in the steps 82, 83 and 84 of FIG. 7.

According to the above-mentioned example, the setting or change of the information of reference mark shall be carried out thrice, but it may be carried out four or more times according to the selection of the wire bonding position and the marks for positioning.

Then, at the time of actual production, since there is a need to redefine the reference mark suitable for locating a bonding position, the following examples can be considered.

If the information on reference mark that can control, store and output by the program in the main controller 45 is made to 4 sets, it is possible to leave the programming made for automatic return to the reference mark suitable to the mark for positioning at the time of actual production. As a matter of course, 3 sets and more than 5 sets are acceptable.

Further, the above has handled the information on reference mark entirely as data of M/C (wire bonder), i.e., the information on reference mark does not change by changing the producing kind, but it can be considered also to handle it as data of kind (IC) just like the conventional bonding parameters, etc. and store them to the kind storage RAM area or the external storage media, i.e., the information on reference mark changes by changing the producing kind.

The invention has been described above for an example in which position specification was carried out for a bonding pad and inner leads. However, the invention is not restricted to this embodiment, and could be applied to position specification for special patterns, for alignment, for example. The number of pre-set reference patterns is also not limited to two. Patterns can be stored in accordance with the number and types of target patterns.

By means of the embodiment as described above, it is arranged that at least two or more types of reference marks are stored in a wire bonding device and the optimum reference mark is selected and displayed on a monitor depending on the target pattern. Thus, the reference mark which is most suitable for different types of target pattern can be displayed. This makes it possible to perform the teaching operation easily and accurately.

Obviously, numerous modifications and variations of the present invention are possible in light of the above teachings. It is therefore to be understood that within the scope of the appended claims, the invention may be practiced otherwise than as specifically described herein.

What is claimed is:

1. A wire bonding device comprising:
   camera means for producing image signals corresponding to a field of view including an object having plural target patterns on which wire bonding is to be performed;
   displacement means coupled to said camera means for altering the field of view by varying the relative positioning between the camera means and the object;
   monitor means for displaying an image of the object to be wire bonded based on the image signals produced by said camera means;
   reference mark display generation means coupled to said monitor means for combining reference mark signals with said image signals so that an image of a reference mark is superimposed on the image of each target pattern displayed by said monitor means;
   reference mark generation means for storing data corresponding to a plurality of reference marks and for producing reference mark signals defining a selected reference mark and applying said reference mark signals to said reference mark display generation means; and
   input selection and control means coupled to said reference mark generation means for selecting a respective reference mark shape and size tailored to each target pattern and for producing corresponding selection signals applied to said reference mark generation means, said reference mark generation means producing said reference mark signals in correspondence with said selection signals 2. The wire bonding device according to claim 1, wherein said input selection and control means includes means for selecting a rectangular reference mark and the length and width of the rectangular reference mark, and wherein said reference mark generation means produces and applies to said reference mark display generation means reference signals which are displayed by said monitor means as a rectangle having the selected length and width.

3. The wire bonding device according to claim 1, wherein said input selection and control means includes means for selecting a circular reference mark and the diameter of the circular reference mark, and wherein said reference mark generation means produces and applies to said reference mark display generation means reference mark signals which are displayed by said monitor means as a circle having the selected diameter.

4. The wire bonding device according to claim 1, wherein the target patterns include a first pattern on a semiconductor pellet and a second pattern on a lead frame, and the reference mark generation means stores first reference mark data adapted for position location of the first pattern and second reference mark data adapted for position location of the second pattern.

5. The wire bonding device according to claim 4, wherein the first pattern is that of a bonding pad and the second pattern is that of an inner lead.

* * * * *